(12) United States Patent
Ohtani

(10) Patent No.: US 6,671,213 B2
(45) Date of Patent: Dec. 30, 2003

(54) THIN FILM MAGNETIC MEMORY DEVICE HAVING REDUNDANCY REPAIR FUNCTION

(75) Inventor: Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/194,256

(22) Filed: Jul. 15, 2002

(65) Prior Publication Data

US 2003/0133334 A1 Jul. 17, 2003

(30) Foreign Application Priority Data

Jan. 15, 2002 (JP) ........................................ 2002-006424

(51) Int. Cl.[7] ................................................. G11C 7/00
(52) U.S. Cl. .................................. 365/200; 365/230.06
(58) Field of Search ................................ 365/200, 201, 365/185.09, 230.06, 230.08

(56) References Cited

U.S. PATENT DOCUMENTS 5,523,974 A * 6/1996 Hirano et al. ............... 365/200
6,256,237 B1 * 7/2001 Ho et al. ..................... 365/200
6,331,949 B1 * 12/2001 Hirano ........................ 365/200

FOREIGN PATENT DOCUMENTS

JP      8-279299      10/1996

* cited by examiner

Primary Examiner—Tan T. Nguyen
(74) Attorney, Agent, or Firm—McDermott, Will & Emery

(57) ABSTRACT

Each of program units which is arranged to be adjacent to a memory array, stores redundant information of 1 bit necessary for replacement and repair. Prior to normal data read operation, the redundant information read from the program units is latched in a row select circuit. The row select circuit selectively activates one of word lines corresponding to the normal memory cells and a spare word line in accordance with whether the defective row addresses indicated by the redundant information are matched to an inputted row addresses, respectively.

8 Claims, 13 Drawing Sheets

THIN FILM MAGNETIC MEMORY DEVICE HAVING REDUNDANCY REPAIR FUNCTION

BACKGROUND OF THE INVENTION

1. Field of the Invention

The present invention relates to a thin film magnetic memory device, and more specifically relates to a thin film magnetic memory device having a redundancy configuration for repairing a defective memory cell.

2. Description of the Background Art

Attention has been paid to an MRAM (Magnetic Random Access Memory) device as a memory device capable of storing nonvolatile data with lower consumption power. The MRAM device is a memory device which stores nonvolatile data using a plurality of thin film magnetic elements formed on a semiconductor integrated circuit and which can randomly access the respective thin film magnetic elements.

In recent years, it has been made public that the performance of the MRAM device surprisingly advances particularly by using a thin film magnetic body using a magnetic tunnel junction (MTJ) as a memory cell.

FIG. 11 is a schematic diagram showing the configuration of a memory cell having a magnetic tunnel junction (which memory cell will be also referred to simply as "MTJ" memory cell hereinafter).

Referring to FIG. 11, MTJ memory cell includes a tunneling magneto-resistance element TMR having electric resistance changing according to storage data level, and an access element ATR for forming the path of a sense current Is which passes through tunneling magneto-resistance element TMR during data read. Since access element ATR is typically formed out of a field effect transistor, access element ATR will be also referred to as "access transistor ATR" hereinafter. Access transistor ATR is connected between tunneling magneto-resistance element TMR and a fixed voltage (ground voltage Vss).

FIG. 12 is a conceptual view for explaining data read from an MTJ memory cell.

Referring to FIG. 12, tunneling magneto-resistance element TMR includes a ferromagnetic layer FL which has a fixed, uniform magnetization direction (which layer will be also referred to simply as "fixed magnetic layer" hereinafter) and a ferromagnetic layer VL which is magnetized in a direction according to an externally applied magnetic field (which layer will be also referred to simply as "free magnetic layer" hereinafter). A tunneling barrier (tunneling film) TB formed out of an insulating film is provided between fixed magnetic layer FL and free magnetic layer VL. Free magnetic layer VL is magnetized in the same direction as or the opposite direction to the magnetization direction of fixed magnetic layer FL in accordance with the level of written, stored data. Fixed magnetic layer FL, tunneling barrier TB and free magnetic layer VL form a magnetic tunnel junction.

During data read, access transistor ATR is turned on in accordance with the activation of a word line WL. As a result, sense current Is can be fed to a current path from a bit line BL to tunneling magneto-resistance element TMR, access transistor ATR and a ground voltage Vss.

The electric resistance of tunneling magneto-resistance element TMR changes according to the relative relationship in magnetization direction between fixed magnetic layer FL and free magnetic layer VL. More specifically, if the magnetization direction of fixed magnetic layer FL is the same as (parallel to) that of free magnetic layer VL, the electric resistance of tunneling magneto-resistance element TMR becomes lower than that of tunneling magneto-resistance element TMR if the magnetization direction of fixed magnetic layer FL is opposite (anti-parallel) to that of free magnetic layer FL.

Accordingly, if free magnetic layer VL is magnetized in one of the two directions in accordance with stored data, the voltage change of tunneling magneto-resistance element TMR caused by sense current Is differs according to the level of the stored data. Therefore, if bit line BL is precharged with a constant voltage and then sense current Is is fed to tunneling magneto-resistance element TMR, it is possible to read the data stored in the MTJ memory cell by detecting the voltage of bit line BL.

FIG. 13 is a conceptual view for explaining a data write operation for writing data to the MTJ memory cell.

Referring to FIG. 13, during data write, word line WL is inactivated and access transistor ATR is turned off. In this state, a data write current for magnetizing free magnetic layer VL in a direction according to written data is fed to a write digit line WDL and a bit line BL, respectively. The magnetization direction of free magnetic layer VL is determined according to data write currents fed to write digit line WDL and that fed to bit line BL, respectively.

FIG. 14 is a conceptual view for explaining the relationship between the data write current and the magnetization direction of tunneling magneto-resistance element TMR during data write to the MTJ memory cell.

Referring to FIG. 14, a horizontal axis H (EA) indicates a magnetic field applied in an easy axis (EA) direction in free magnetic layer VL in tunneling magneto-resistance element TMR. A vertical axis H (HA) indicates a magnetic field applied in a hard axis (HA) direction in free magnetic layer VL. Magnetic fields H(EA) and H(HA) correspond to two magnetic fields generated by currents fed to bit line BL and write digit line WDL, respectively.

In the MTJ memory cell, the fixed magnetization direction of fixed magnetic layer FL is along the easy axis of free magnetic layer VL, and free magnetic layer VL is magnetized in the parallel direction or anti-parallel (opposite) direction to the magnetization direction of fixed magnetic layer FL along the easy axis direction in accordance with the level ("1" or "0") of the stored data. In the specification, the electric resistances of tunneling magneto-resistance element TMR corresponding to the two magnetization directions of free magnetic layer VL will be denoted by Rmax and Rmin (where Rmax>Rmin) hereinafter, respectively. The MTJ memory cell can store 1-bit data ("1" or "0") in accordance with one of these two magnetization directions of free magnetic layer VL.

The magnetization direction of free magnetic layer VL can be rewritten only if the sum of applied magnetic fields H(EA) and H(HA) reaches a region outside of an asteroid characteristic line shown in FIG. 14. Namely, if the applied data write magnetic fields have intensity corresponding to a region inside of the asteroid characteristic line, the magnetization direction of free magnetic layer VL has no change.

As shown in the asteroid characteristic line, if a magnetic field in the hard axis (HA) direction is applied to free magnetic layer VL, it is possible to decrease a magnetic threshold value necessary to switch the magnetization direction along the easy axis.

If operation points during data write are designed as shown in the example of FIG. 14, the data write magnetic field in the easy axis direction is designed to have an intensity of $H_{WR}$ in the data write target MTM memory cell.

That is, the value of the data write current fed to bit line BL or write digit line WDL is designed so as to obtain this data write magnetic field $H_{WR}$. Generally, data write magnetic field $H_{WR}$ is expressed by the sum of a switching magnetic field $H_{SW}$ necessary to change over a magnetization direction and a margin $\Delta H$. That is, data write magnetic field $H_{WR}$ is expressed by $H_{WR}=H_{SW}+\Delta H$.

To rewrite the data stored in the MTJ memory cell, i.e., to rewrite the magnetization direction of tunneling magneto-resistance element TMR, it is necessary to feed a data write current at not lower than predetermined level to each of write digit line WDL and bit line BL. By doing so, free magnetic layer VL in tunneling magneto-resistance element TMR is magnetized in the parallel or opposite (anti-parallel) direction to the magnetization direction of fixed magnetic layer FL in accordance with the direction of the data write magnetic field along the easy axis (EA). The magnetization direction, i.e., the stored data of the MTJ memory cell which has been written to tunneling magneto-resistance element TMR is held in a nonvolatile manner until new data is written.

Normally, a memory device includes a redundant configuration for repairing a normal memory cell to which a defect occurs (which memory cell will be also referred to as "defective memory cell" hereinafter) in addition to a plurality of normal memory cells selectively accessible according to an access signal.

FIG. 15 is a schematic block diagram which shows the configuration of a conventional MRAM device including a redundant configuration. In FIG. 15, the configuration related to data read, of such an MRAM device is typically shown.

Referring to FIG. 15, the conventional MRAM device includes a memory array MA in which a plurality of normal memory cells MC and spare memory cells SMC for repairing defective memory cells are arranged in a matrix, a row select circuit RDC and a column select circuit CDC.

In memory array MA, a plurality of spare memory cells SMC are arranged to constitute a spare row. In FIG. 15, normal memory cells MC arranged in 4 rows×4 columns and spare memory cells SMC arranged in 1 row×4 columns are shown by way of example. A spare word line SWL and word lines WL0 to WL3 are arranged to correspond to the row of the spare memory cells and the rows of the normal memory cells, respectively. Namely, in the MRAM device shown in FIG. 15, a defective memory cell is replaced and relieved in units of a defective memory cell row including the defective memory cell.

On the other hand, spare memory cells SMC and normal memory cells MC are arranged so that each memory cell column is shared among SMC and MC. Bit lines BL0 to BL3 are arranged to correspond to the memory cell columns, respectively. Sense amplifiers SA0 to SA3 are provided to correspond to bit lines BL0 to BL3, respectively. Sense amplifiers SA0 to SA3 amplify data transmitted through bit lines BL0 to BL3, respectively.

Row select circuit RDC stores redundant information including information which indicates the presence/absence of a defective memory cell, i.e., whether or not the spare row is used and information for specifying the defective memory cell, and executes row selection in accordance with the redundant information and inputted row addresses RA0 and RA1.

Column select circuit CDC executes column selection in accordance with inputted column addresses CA0 and CA1, and outputs data, read from one of bit lines BL0 to BL3 corresponding to the selected column, to an external I/O (EI/O) provided to execute the transmission and receiving of data to and from the outside of the MRAM device.

FIG. 16 is a circuit diagram which shows the configuration of row select circuit RDC.

Referring to FIG. 16, row select circuit RDC includes a spare decoder SD and row select gates RLG0 to RLG3 which constitute a normal row decoder.

Spare decoder SD includes fuse elements FS0 to FS2 for storing information used for redundancy repair in a nonvolatile manner. Fuse elements FS0 and FS1 store the levels of row addresses RA0 and RA1 for showing the defective memory cell row, respectively. Fuse element FS2 stores information which indicates whether or not the spare row is used.

Each of fuse elements FS0 to FS2 is programmed by the cut off (blow) of the fuse element in accordance with the input of a laser beam or the like. Namely, each fuse element FS can hold 1-bit information in a nonvolatile manner in accordance with a blown state (cut off state) or a non-blown state (conductive state).

Spare decoder SD includes a latch circuit LT0 which latches a voltage according to the state of fuse element FS0 to a node Ng0, a latch circuit LT1 which latches a voltage according to the state of fuse element FS1 to node Ng1, and a transistor 100 which pulls up each of nodes Ng0 and Ng1 to a power supply voltage Vcc. In each of latch circuits LT0 and LT1, the driving force of an inverter having node Ng0 or Ng1 as an input side is designed to be higher than the driving force of transistor 100.

Spare decoder SD also includes transistor gates 101 and 102 provided between nodes to which row addresses RA0 and /RA0 (at inverted level of that of RA0) are transmitted and a node Ns0, respectively, and transistor gates 103 and 104 provided between nodes to which row addresses RA1 and /RA1 (at inverted level of that of RA1) are transmitted and a node Ns1, respectively. Each of transistor gates 101 to 104 consists of, for example, an N-channel MOS transistor.

Spare decoder SD further includes a P-channel MOS transistor 105 which is connected between power supply voltage Vcc and a node Ns2, and N-channel MOS transistors 106, 107 and 108 which are connected in series between node Ns2 and ground voltage Vss.

The gate of transistor 105 is coupled to ground voltage Vss. The gate of transistor 106 is connected to node Ns0 and that of transistor 107 is connected to node Ns1. The gate of transistor 108 is coupled to power supply voltage Vcc through fuse element FS2. An inverter 109 drives spare word line SWL in accordance with the inverted voltage level of node Ns2.

The operation of spare decoder SD will next be described.

If no defective memory cell exists in the normal memory cells, i.e., the spare row is not used, then fuse element FS2 is blown and turned into a cut off state. In this state, transistor 108 is always set to be turned off, so that the voltage of node Ns2 is fixed to power supply voltage Vcc (H level). As a result, spare word line SWL is kept to be in an inactive state (ground voltage Vss: L level).

In the specification, high voltage level (e.g., power supply voltage Vcc) corresponding to "1" and low voltage level (e.g., ground voltage Vss) corresponding to "0", where "1" and "0" are binary voltage levels of data, a signal, a signal line and the like, will be also referred to simply as "H level" and "L level", respectively.

On the other hand, if the spare row is used to replace a defective memory cell, the fuse element FS2 is kept to be in conductive state and the levels of row addresses RA0 and RA1 which indicate the defective memory cell row are programmed by fuse elements FS0 and FS1.

If fuse element FS0 is in a cut off state, node Ng0 is set at power supply voltage Vcc (H level) by transistor 100. In response to this setting, transistor 101 is turned on and transistor gate 102 is turned off. Due to this, when row address RA0="1", transistor 106 is turned on and when row address RA0="0", transistor 106 is turned off.

If fuse element FS0 is in conductive state, node Ng0 is set at L level (ground voltage Vss). In response to this setting, transistor 102 is turned on while transistor 101 is turned off. Due to this, when row address RA0="0", transistor 106 is turned on and when row address RA0="1", transistor 106 is turned off.

In this way, if fuse element FS0 is in a cut off state and row address RA0 is "1" (at H level), transistor 106 is turned on. If fuse element FS0 is in a conductive state and row address RA0 is "0" (at L level), transistor 106 is turned off. In other words, transistor 106 can be turned on in accordance with the predetermined level of row address RA to correspond to the state of row address RA0 programmed by fuse element FS0.

Likewise, fuse element FS1, latch circuit LT1, transistor gates 103 and 104 and transistor 107 are provided for row address RA1 as in the case of fuse element FS0, latch circuit LT0, transistor gates 101 and 102 and transistor 106 provided for row address RA0.

Therefore, transistor 107 is turned on in response to the predetermined level of row address RA1 to correspond to the state of row address RA1 programmed by fuse element FS1.

If row address RA0 corresponding to the defective memory cell row is "1", fuse element FS0 is turned into a cut off state and if row address RA0 is "0", fuse element FS0 is turned into a conductive state, whereby row address RA0 which indicates the defective memory cell row can be programmed. Likewise, row address RA1 corresponding to the defective memory cell row can be programmed by fuse element FS1.

According to such a configuration of spare decoder SD, if fuse element FS2 is not blown but is in the conductive state and the row addresses of the defective memory cell row programmed by fuse elements FS0 and FS1 are consistent with inputted row addresses RA0 and RA1, respectively, then spare word line SWL is driven to H level and thereby activated.

The activation of word lines WL0 to WL3 corresponding to the normal memory cell rows is controlled by row select gates RLG0 to RLG3, respectively.

Row select gate RLG0 controls the activation of word line WL0 in accordance with an AND operation result for the voltage levels of row addresses /RA0 and /RA1 and node Ns2. Word line WL0 is, therefore, activated to H level if node Ns2 is at L level (i.e., spare word line SWL is in the inactive state), RA0="0" and RA1="0".

Likewise, row select gate RLG1 controls the activation of word line WL1 in accordance with an AND operation result for the voltage levels of row addresses /RA0 and RA1 and node Ns2. Word line WL1 is, therefore, activated to H level if spare node line SWL is inactive, RA0="0" and RA1="1".

Row select gate RLG2 controls the activation of word line WL2 in accordance with an AND operation result for the voltage levels of row addresses RA0 and /RA1 and node Ns2. Word line WL2 is, therefore, activated to H level if spare word line SWL is inactive, RA0="1" and RA1="0".

Row select gate RLG3 controls the activation of word line WL3 in accordance with an AND operation result for the voltage levels of row addresses RA0 and RA1 and node Ns2. Word line WL3 is, therefore, activated to H level if spare word line SWL is inactive, RA0="1" and RA1="1".

By adopting such a configuration, if spare word line SWL is activated, each of word lines WL0 to WL3 is inactivated to L level. If spare word line SWL is inactive, one of word lines WL0 to WL3 is selectively activated in response to a combination of row addresses RA0 and RA1.

According to the MRAM device shown in FIG. 15, therefore, it is possible to replace and repair a defective memory cell in the normal memory cells by the spare row consisting of spare memory cells SMC.

As described above, to realize the redundant configuration, the conventional MRAM device is required to include fuse elements which are cut off (blown) in response to the input of a laser beam or the like. This, in turn, requires a special equipment such as a laser trimming device and requires a processing step therefor, disadvantageously increasing time and cost required for a programming processing. Further, since each fuse element has a relatively large area, the area of the MRAM device is thereby disadvantageously increased. Besides, if external input such as laser irradiation causes physical destruction, other necessary circuits are disadvantageously damaged and the operation reliability of the overall MRAM device may possibly be deteriorated.

SUMMARY OF THE INVENTION

It is an object of the present invention to provide a configuration of a thin film magnetic memory device capable of programming information necessary for redundancy repair using the same magnetic storage element as a normal memory cell used for data storage.

In short, the present invention provides a thin film magnetic memory device which includes a memory array, a plurality of program units, a program information read portion, and a select circuit. In the memory array, a plurality of normal memory cells and a plurality of spare memory cells each for replacing and repairing a defective memory cell in the plurality of normal memory cells are arranged in a matrix. Each of the plurality of program units stores redundant information of 1 bit used for replacing the defective memory cell. The program information read section reads the redundant information from the plurality of program units before executing a data read operation. The select circuit controls access to the plurality of normal memory cells and the plurality of spare memory cells in accordance with the redundant information read by the program information read portion and an inputted address signal. Each of the program units includes two program cells each having a same configuration as a configuration of each of the normal memory cells and the spare memory cells, and the two program cells store data at different levels, respectively.

Therefore, a main advantage of the present invention is in that it is possible to store the redundant information in a nonvolatile manner without providing any fuse elements, by using program cells each of which is the same in configuration as the normal memory cells and the spare memory cells and each of which is formed to have a small area. As a result, it is possible to magnetically write data as in the case of normal data write without requiring a special processing step and a dedicated equipment and without causing physical destruction. Consequently, it is possible to program the redundant information without causing the increase of processing time and processing cost and further without any risk of deteriorating the operation reliability of the entire device.

It is preferable that the program information read section includes a power-ON detection circuit for detecting whether the thin film magnetic memory device is turned on, and a plurality of program information read units for reading the redundant information from a plurality of program cells for a predetermined period after the thin film magnetic memory device is turned on. The select circuit preferably includes a latch circuit for holding the redundant information read from the plurality of program units while the thin film magnetic memory device is turned on.

As a result, since it is possible to obtain the redundant information only by causing a data read current to pass through the program cells only for a relatively short period right after the thin film magnetic memory device is turned on, it is possible to suppress the occurrence of program cell failure and to improve operation reliability.

According to another aspect of the present invention, there is provided a thin film magnetic memory device which includes a memory array, a plurality of data lines, a data read circuit and a select circuit. In the memory array, plurality of normal memory cells, a plurality of spare memory cells for replacing and repairing a defective memory cell in the plurality of normal memory cells, and a plurality of program cells for storing redundant information used for replacing the defective memory cell are arranged in a matrix. The data lines are each shared among the plurality of normal memory cells, the plurality of spare memory cells and the plurality of program cells. The data read circuit reads data from the plurality of normal memory cells, the plurality of spare memory cells and the plurality of program memory cells through the data lines. The select circuit includes a latch circuit holding the redundant information read by the data read circuit from the plurality of program units before executing a data read operation. The select circuit controls access to the plurality of normal memory cells and the plurality of spare memory cells in accordance with an address signal and the redundant information held in the latch circuit.

According to the thin film magnetic memory device constituted as described above, it is possible to store the redundant information in a nonvolatile manner without providing any fuse elements, by using program cells each of which is the same in configuration as the normal memory cells and the spare memory cells and each of which is formed to have a small area. In addition, since it is unnecessary to separately provide a dedicated circuit for reading the redundant information from the program cells, it is possible to reduce circuit area. Further, since it is possible to obtain the redundant information only by causing a data read current to pass through the program cells only for relatively a short period right after the thin film magnetic memory device is turned on, it is possible to suppress the occurrence of program cell failure and to improve operation reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
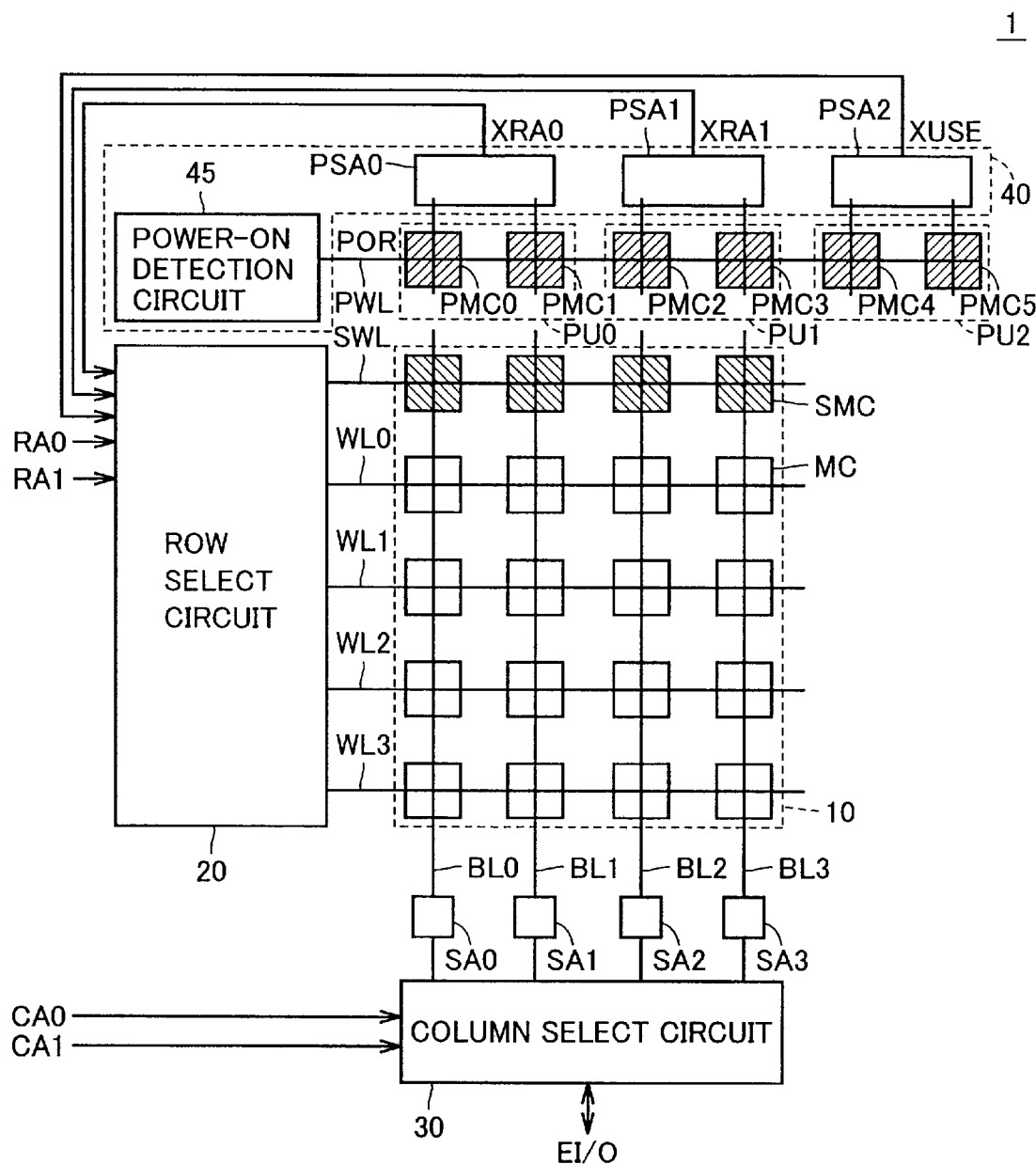
FIG. 1 is a block diagram showing a configuration of an MRAM device according to a first embodiment of the present invention.

The embodiments of the present invention will be described hereinafter in detail with reference to the drawings. It is noted that same reference symbols denote same or corresponding sections in the drawings.

First Embodiment

FIG. 1 is a block diagram showing the configuration of an MRAM device 1 according to the first embodiment of the present invention. In FIG. 1, a circuit group related to data read operation and including a redundant configuration, in MRAM device 1 is typically shown.

Referring to FIG. 1, MRAM device 1 according to the first embodiment includes a memory array 10, a row select circuit 20, a column select circuit 30, program units PU0 to PU2 each of which is arranged to be adjacent to memory array 10 and each of which consists of program cells PMC, and a program information read section 40 which reads data from the program units.

Memory array 10 includes a plurality of normal memory cells MC arranged in a matrix and spare memory cells SMC. Spare memory cells SMC are arranged to constitute a spare row. That is, normal memory cells MC and spare memory cells SMC are arranged so that each memory cell column is shared among normal memory cells MC and spare memory cells SMC.

Figure 15:
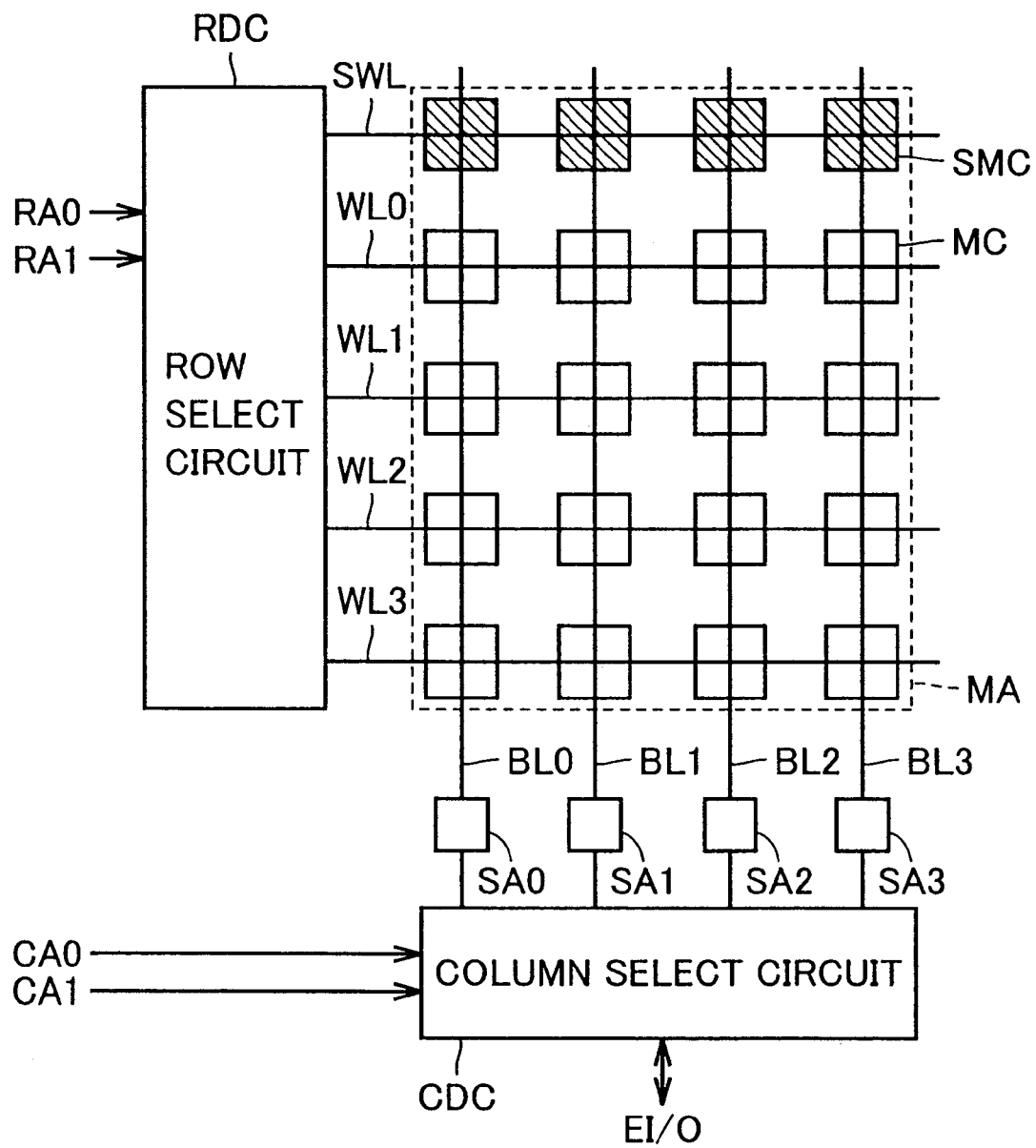
FIG. 15 is a schematic block diagram showing a configuration of a conventional MRAM device which includes a redundant configuration.

In FIG. 1 as in the case of the configuration shown in FIG. 15, normal memory cells MC arranged in 4 rows×4 columns and spare memory cells SMC arranged in 1 row×4 columns are shown. However, if the present invention is applied to MRAM device 1, the number of arranged normal memory cells MC and spare memory cells SMC is not limited to a specific number but may be arbitrarily set.

Word lines WL0 to WL3 are arranged to correspond to the normal memory cell rows, respectively, and spare word line SWL is arranged to correspond to the spare row. Further, bit lines BL0 to BL3 are arranged to correspond to the memory cell columns, respectively. Each of bit lines BL0 to BL3 is shared among normal memory cells MC and spare memory cell SMC in the corresponding memory cell column. Sense amplifiers SA0 to SA3 provided to correspond to bit lines BL0 to BL3 amplify the voltages of corresponding bit lines BL0 to BL3 and generate read data, respectively.

Each of program units PU0 to PU2 consists of two program cells. Program unit PU0 includes program cells PMC0 and PMC1, program unit PU1 includes program cells PMC2 and PMC3, and program unit PU2 includes program cells PMC4 and PMC5. If the program cells are generally referred, they will be denoted by program cell PMC. Each program unit stores 1-bit information. Two program cells PMC which constitute each program unit PU store data at different levels, respectively.

Program cells PMC are arranged to constitute a program cell row and a program word line PWL is provided to correspond to the program cell row. While FIG. 1 shows an example of the configuration in which program cells PMC are arranged in 1 row×6 columns, the number of arranged program cells PMC is not limited to a specific number but may be arbitrarily set in the present invention. For example, program cells PMC can be arranged to constitute a plurality of program cell rows.

Figure 11:
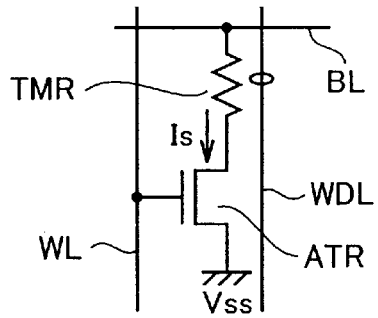
FIG. 11 is a schematic diagram showing a configuration of an MTJ memory cell.
Figure 12:
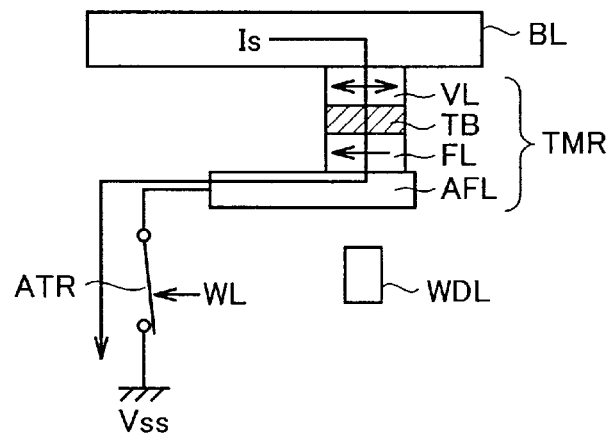
FIG. 12 is a conceptual view explaining data read from the MTJ memory cell.
Figure 13:
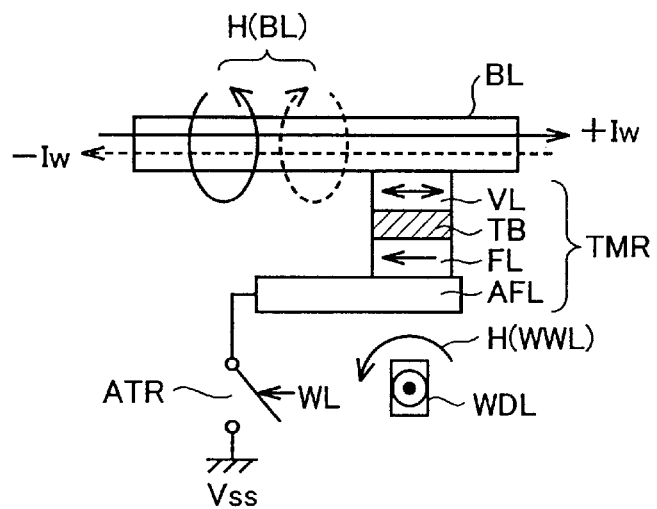
FIG. 13 is a conceptual view explaining data write operation for writing data to the MTJ memory cell.
Figure 14:
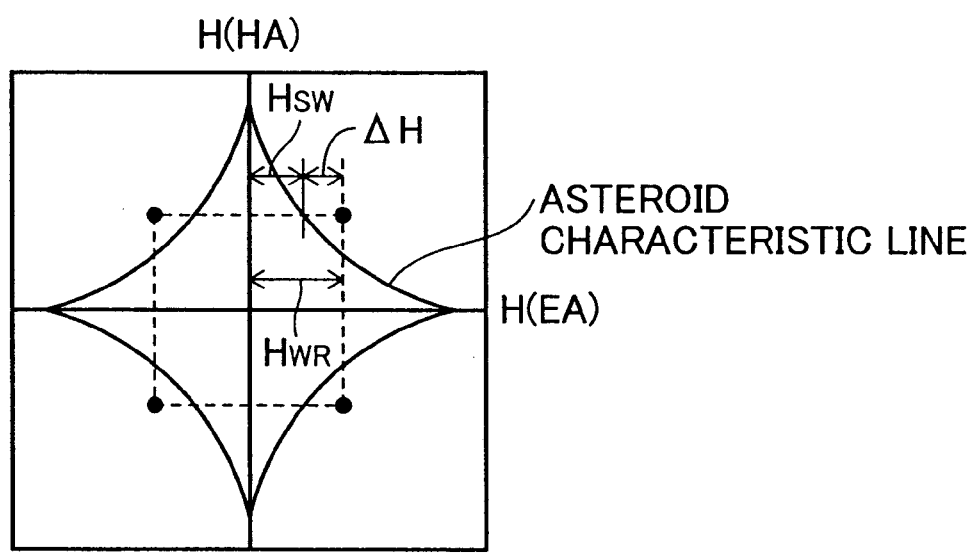
FIG. 14 is a conceptual view explaining the relationship between a data write current and a magnetization direction of a tunneling magneto-resistance element when data is written to the MTJ memory cell.

Each of normal memory cell MC, spare memory cell SMC and program cell PMC has the same configuration as that shown in FIG. 11. Namely, in normal memory cell MC, the gate of access transistor ATR is connected to corresponding word line WL. In spare memory cell SMC, the gate of access transistor ATR is connected to spare word line SWL. In program cell PMC, the gate of access transistor ATR is connected to program word line PWL.

Program information read section 40 includes a power-ON detection circuit 45, and program sense amplifiers PSA0 to PSA2 provided to correspond to program units PU0 to PU1, respectively.

Figure 2A:
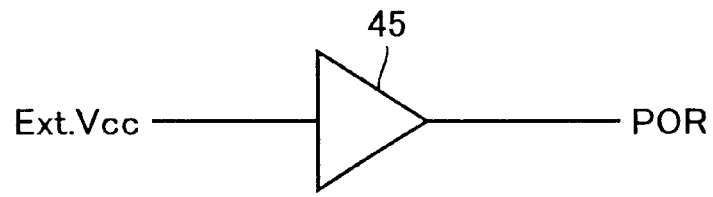
FIGS. 2A and 2B are conceptual views explaining the operation of a power-ON detection circuit shown in FIG. 1.

Referring to FIG. 2A, power-ON detection circuit 45 generates a power-ON reset signal POR in response to an external power supply voltage Ext.Vcc supplied to MRAM device 1. Power-ON reset signal POR is transmitted to program word line PWL.

Figure 2B:
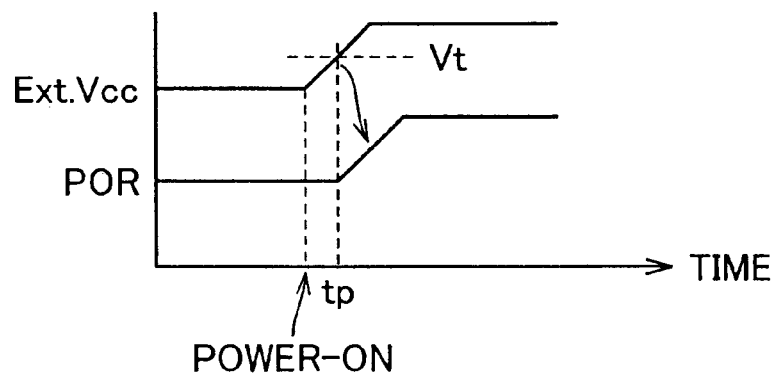

Referring to FIG. 2B, at time tp corresponding to timing at which external power supply voltage Ext.Vcc, which rises when MRAM device 1 is turned on, exceeds a predetermined voltage Vt, power-ON reset signal POR is activated to H level. Power-ON detection circuit 45 can thereby activate program word line PWL to H level at least before data read operation.

Figure 3:
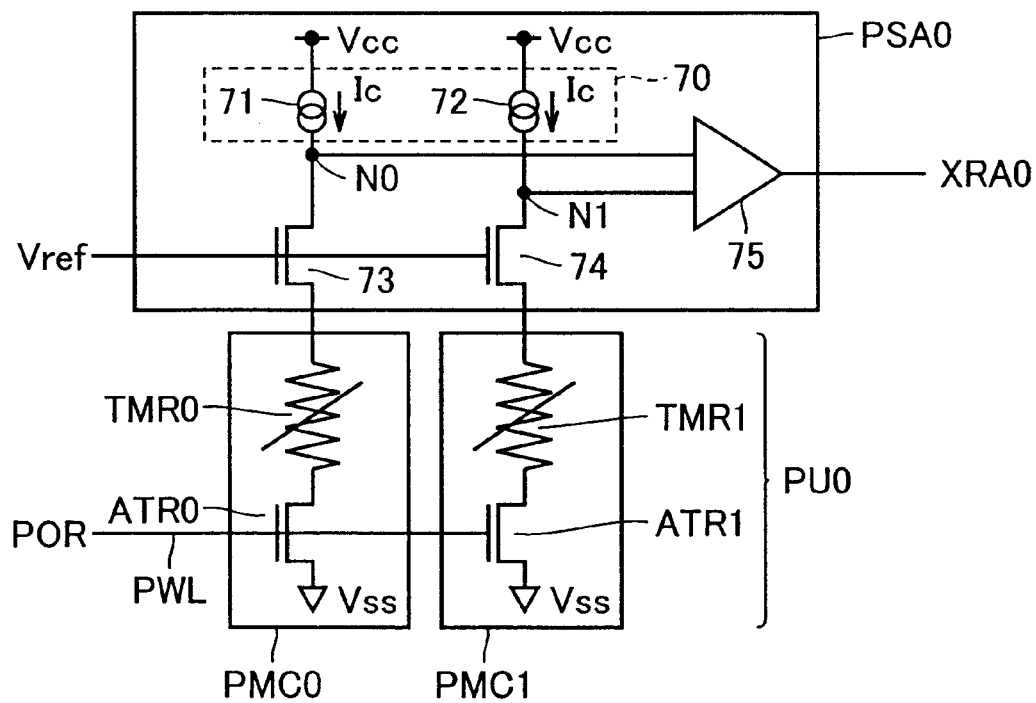
FIG. 3 is a circuit diagram showing a configuration of a program sense amplifier shown in FIG. 1.

FIG. 3 is a circuit diagram showing the configuration of program sense amplifiers PSA0 to PSA2. Since program sense amplifiers PSA0 to PSA2 are the same in configuration, the configuration of program sense amplifier PAS0 is typically shown in FIG. 3 and will be typically described herein.

Referring to FIG. 3, program sense amplifier PSA0 is provided to correspond to program cells PMC0 and PMC1.

Program sense amplifier PSA0 includes a current supply section 70 which supplies a constant current Ic to nodes N0 and N1, an N-channel MOS transistor 73 which is connected in series to program cell PMC0 between node N0 and ground voltage Vss, and an N-channel MOS transistor 74 which is connected in series to program cell PMC1 between node N1 and ground voltage Vss. Current supply section 70 includes current sources 71 and 72 provided to correspond to nodes N0 and N1, respectively.

Each program cell PMC is the same in configuration as normal memory cell MC and spare memory cell SMC as already described above. Program cell PMC0, for example, includes a tunneling magneto-resistance element TMR0 and an access transistor ATR0 which are connected in series between node N0 and ground voltage Vss. Likewise, program cell PMC1 includes a tunneling magneto-resistance element TMR1 and an access transistor ATR1 which are connected in series between node N0 and ground voltage Vss.

Program cells PMC0 and PMC1 store data at different levels ("1" and "0"). That is, the electric resistances of tunneling magneto-resistance elements TMR0 and TMR1 are set at Rmax and Rmin, respectively.

Access transistors ATR0 and ATR1 in program cells PMC0 and PMC1 are turned on in response to the activation of program word line PWL, i.e., the activation of power-ON reset signal POR.

As a result, in response to the activation of power-ON reset signal POR, the difference in electric resistance between tunneling magneto-resistance elements TMR0 and TMR1, i.e., the voltage difference between polarities corresponding to the difference in stored data level is generated.

Program sense amplifier PAS0 also includes a sense amplifier 75 which amplifies the voltage difference between nodes N0 and N1 and generates a program signal XRA0. For example, if program cells PMC0 and PMC1 store "1" and "0", respectively, program signal XRA0 is set at "1" (H level). If program cells PMC0 and PMC1 store "0" and "1", respectively, program signal XRA0 is set at "0" (L level). In this way, each program unit stores 1-bit information by two program cells PMC which store data at different levels, respectively.

Figure 16:
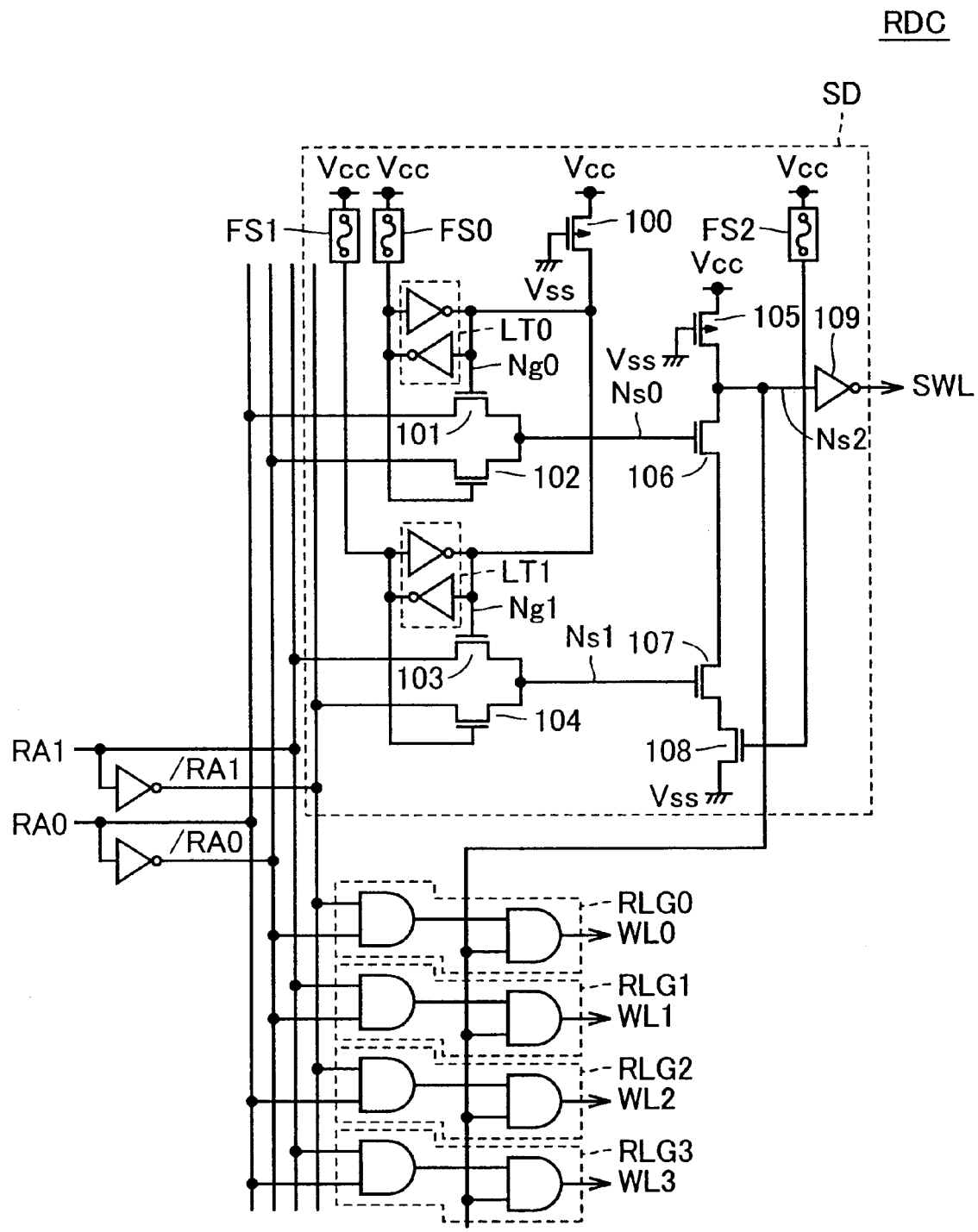
FIG. 16 is a circuit block diagram of a row select circuit shown in FIG. 15.

Referring back to FIG. 1, program units PU0 to PU2 store the same 1-bit information as that of fuse elements FS0 to FS2 shown in FIG. 16, respectively. Program sense amplifiers PSA0 to PSA2 generate program signals XRA0, XRA1 and XUSE in accordance with 1-bit information which the corresponding program units store, respectively.

Program signals XRA0 and XRA1, therefore, indicate the levels of row addresses RA0 and RA1 which shows a defective memory cell row, respectively, and program signal XUSE indicates that the spare row arranged as a redundant configuration is used or unused. These pieces of information stored using the program cells (program units) and used for replacement and repair are also generally referred to as "redundant information".

Row select circuit 20 selectively activates one of word lines WL0 to WL3 and spare word line SWL in response to program signals XRA0, XRA1 and XUSE from program information read section 40 and row addresses RA0 and RA1.

Figure 4:
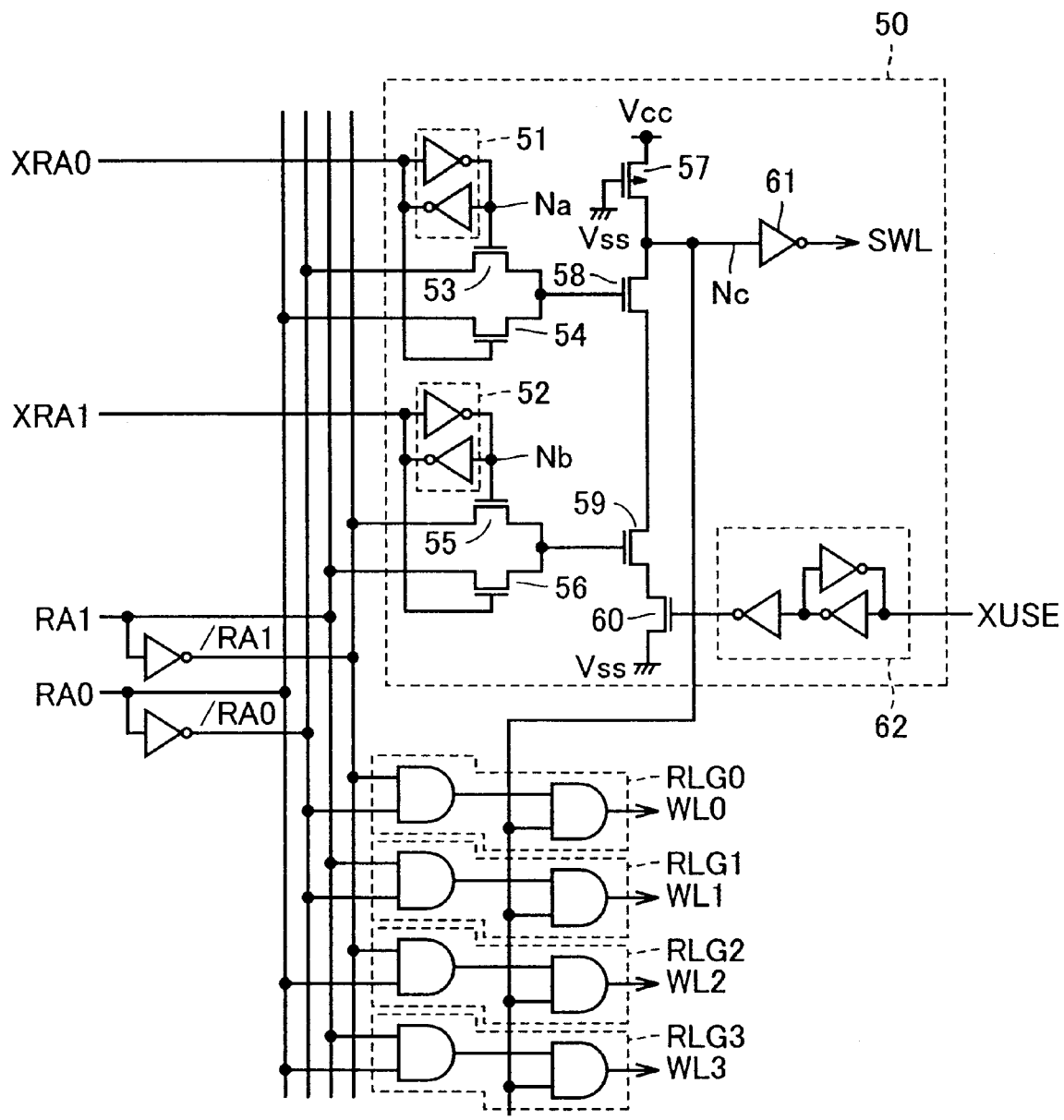
FIG. 4 is a circuit diagram showing a configuration of a row select circuit shown in FIG. 1.

Referring to FIG. 4, row select circuit 20 includes a spare decoder 50 and row select gates RLG0 to RLG3 corresponding to a normal row decoder.

Spare decoder 50 has a configuration in which the inputs of program signals XRA0, XRA1 and XUSE are received in place of the arrangement of fuse elements FS0 to FS2 in conventional spare decoder SD shown in FIG. 16.

That is, spare decoder 50 includes latch circuits 51 and 52 which latch program signals XRA0 and XRA1, respectively, transistor gates 53 to 56 each of which consists of an N-channel MOS transistor, and a P-channel MOS transistor 57 and N-channel MOS transistors 58 to 60 which are connected in series between power supply voltage Vcc and ground voltage Vss.

Spare decoder 50 also includes an inverter 60 which inverts the voltage level of a node Nc corresponding to the connection node of transistors 57 and 58, and a latch circuit 62 which latches program signal XUSE. Spare word line SWL is driven to have a voltage according to the output of inverter 61. Latch circuits 51, 52 and 62 hold program signals XRA0, XRA1 and XUSE while MRAM device 1 is turned on, respectively.

Latch circuits 51 and 52 hold the inverted levels of program signals XRA0 and XRA1 generated in response to the activation of power-ON reset signal POR at nodes Na and Nb, respectively.

When the voltage of node Na is at H level, transistor gate 53 is turned on and transmits row address/RA0 to the gate of transistor 58. Transistor gate 54 is turned on complementarily to transistor gate 53 and, while being turned on, transmits row address RA0 to the gate of transistor 58. Transistor 58 is, therefore, turned on if the level of program signal XRA0 is consistent with that of row address RA0.

Likewise, when the voltage of node Nb is at H level, transistor gate 55 is turned on and transmits row address/RA1 to the gate of transistor 59. Transistor gate 56 is turned on complementarily to transistor gate 55 and, while being turned on, transmits row address RA1 to the gate of transistor 59. Transistor 59 is, therefore, turned on if the level of program signal XRA1 is consistent with that of row address RA1.

Latch circuit 62 keeps the gate voltage of transistor 60 at the level of latched program signal XUSE. Transistor 60 is turned on if program signal XUSE is set at "1" (H level) and turned off if program signal XUSE is set at "0" (L level).

When the spare row is unused, therefore, program signal XUSE is set at "0" (L level). Accordingly, transistor 60 is fixedly turned off and spare word line SWL is kept to be in an inactive state (L level) irrespectively of row addresses RA0 and RA1.

On the other hand, when the spare row is used, program signal XUSE is set at "1" (H level). In this state, spare word line SWL is activated to H level if program signals XRA0 and XRA1 indicating a defective memory cell row are matched to inputted row addresses RA0 and RA1, respectively. If they are not matched, i.e., a defective memory cell row is not selected by inputted row addresses RA0 and RA1, spare word line SWL is inactivated (to L level). In this way, spare decoder 50 executes determination as to whether or not the inputted row addresses are consistent with defective row addresses indicated by redundant information, respectively.

Row select gates RLG0 to RLG3 have the same configuration as that of row select gates RLG0 to RLG3 shown in FIG. 16. When spare word line SWL is inactivated, row select gates RLG0 to RLG3 selectively activate one of word lines WL0 to WL3 in accordance with row addresses RA0 and RA1. When spare word line SWL is activated, word lines WL0 to WL3 are inactivated (to L level).

Therefore, spare decoder 50 sets spare rows in used states by program signal XUSE and activates spare word line SWL to H level if program signals XRA0 and XRA1 consistent with row addresses RA0 and RA1, respectively. Otherwise, spare word line SWL is inactivated to L level.

Referring back to FIG. 1, a voltage corresponding to the data stored in normal memory cells MC and spare memory cell SMC which correspond to one of word lines WL0 to WL3 or spare word line SWL which is selectively activated by row select circuit 20, is read to bit lines BL0 to BL3, respectively. Sense amplifiers SA0 to SA3 amplify the voltages of bit lines BL0 to BL3 and generate read data, respectively.

Figure 5:
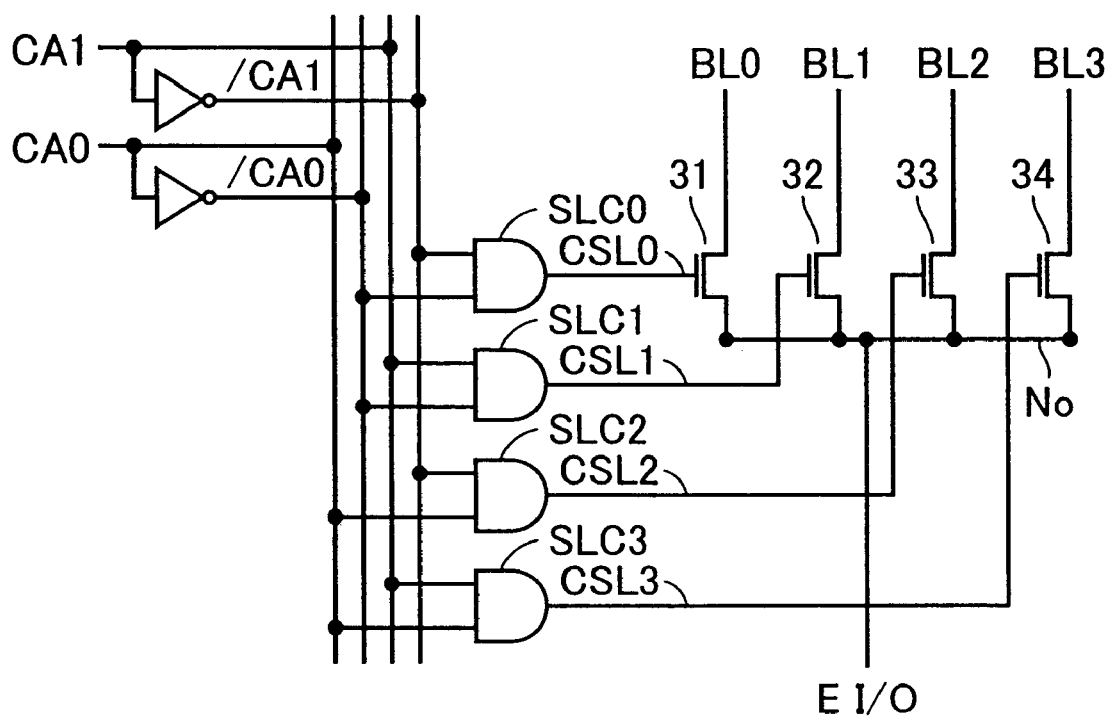
FIG. 5 is a circuit diagram showing a configuration of a column select circuit shown in FIG. 1.

Referring to FIG. 5, column select circuit 30 includes column select switches 31 to 34 which are provided between a node No connected to external I/O (EI/O) and bit lines BL0 to BL3, respectively. Each of column select switches 31 to 34 consists of, for example, an N-channel MOS transistor. On/off of column select switches 31 to 34 are set in response to column select lines CSL0 to CSL3, respectively.

Column select circuit 30 also includes column select gates CSG0 to CSG3 which control the activation of column select lines CSL0 to CSL3, respectively. Column select gates CSG0 to CSG3 control the activation of column select gates CSL0 to CSL3 in accordance with column addresses CA0 and CA1. If column address CA0="0" and column address CA1="0", for example, column select gate CSG0 activates column select line CSL0 to H level. In this case, therefore, the data read to bit line BL0 is transmitted to external I/O (EI/O). Accordingly, one of four column select lines CSL0 to CSL3 is activated to H level in accordance with (four) combinations of the levels of two column addresses CA0 and CA1.

Figure 6:
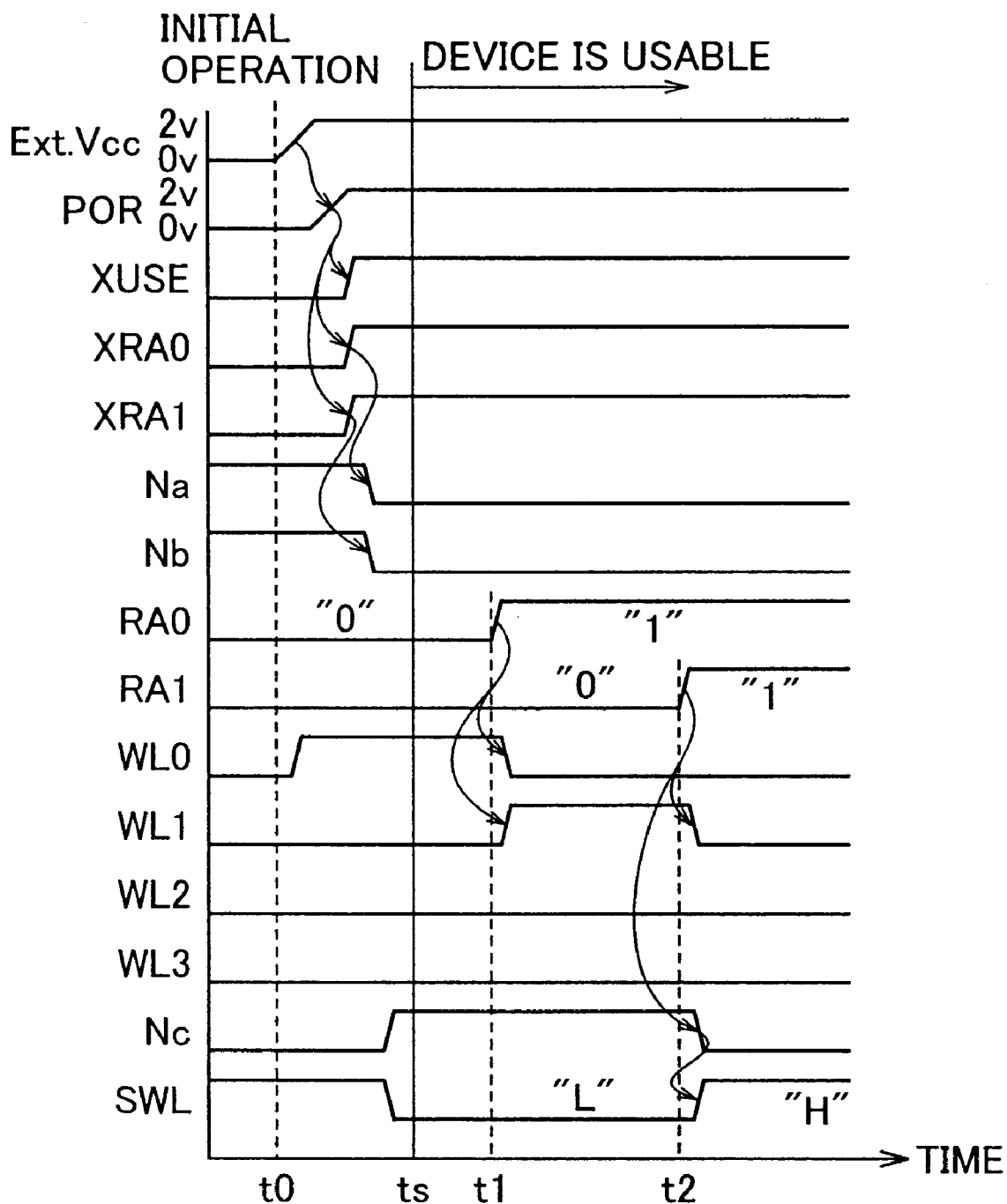
FIG. 6 is an operating waveform view explaining the operation of the MRAM device according to the first embodiment.

Referring to FIG. 6, at time t0, MRAM device 1 is turned on to start initial operation. In response to the rise of external power supply voltage Ext.Vcc, power-ON reset signal POR is activated to H level. In response to the activation of power-ON reset signal POR, redundant information is read from program units PU each consisting of program cells PMC and program signals XUSE, XRA0 and XRA1 are generated.

By way of example, FIG. 6 shows a case where program signals XUSE, XRA0 and XRA1 are "1" (at H level), respectively. In this case, the spare row is set in a used state (XUSE="1"), row addresses RA0=RA1="1" are programmed as defective row addresses. In spare decoder 50, the voltage levels of nodes Na and Nb are kept at L level in accordance with the levels of generated program signals XRA0 and XRA1, respectively.

As can be seen, during the initial operation prior to the execution of data read operation, the redundant information stored in the program units is read and held in spare decoder 50 by the latch circuits. Accordingly, after time ts, the device turns into a usable state, making it possible to execute normal data read.

While FIG. 6 shows an example of the operation for keeping the activation of the power-ON reset signal, i.e., the activation of program word line PWL even after the initial operation, the activation period of program word line PWL may be limited only to a predetermined period of the initial operation. In the latter case, the levels of program signals XUSE, XRA0 and XRA1 are held by the latch circuits provided in spare decoder 50. In other words, as shown in FIG. 6, in the operation state in which the activation of program word line PWL is kept while the device is turned on, the arrangement of latch circuits can be dispensed with in spare decoder 50. However, if the latch circuits are arranged, redundant information can be obtained only by carrying a data read current to the program cells only for relatively a short period after the device is turned on. It is, therefore, possible to suppress the occurrence of program cell failure and to improve operation reliability. If the current pass period of the program cells is shortened, it is possible to improve the operation reliability of the program cells.

After time ts, in periods (time ts to time t1) in which inputted row addresses RA0 and RA1 are set at RA0=RA1="0", row addresses RA0 and RA1 are inconsistent with program signals XRA0 and XRA1 (defective row addresses), respectively and the voltage of node Nc is, therefore, set at H level. As a result, spare word line SWL is set to be inactive (at L level) and word line WL0 corresponding to the normal memory cells is selectively activated to H level.

Next, at time t1, row addresses are changed and row addresses RA0 and RA1 are set at "1" and "0", respectively. In this case, too, row addresses RA0 and RA1 are not completely matched to program signals XRA0 and XRA1 (defective row addresses), respectively. As a result, the voltage of node Nc is kept at H level and spare word line SWL is kept to be inactive (at L level). Furthermore, in response to the change of the row addresses, word line WL1 in place of word line WL0 is selectively activated (to H level).

At time t2, the row addresses are further changed and row addresses RA0 and RA1 are set at RA0=RA1="1", respectively. In this state, row addresses RA0 and RA1 are completely matched to program signals XRA0 and XRA1 (defective row addresses), respectively. In other words, the defective memory cell row is selected. In this case, the voltage of node Nc is changed from H level to L level.

In response to the level change of the voltage of node Nc, spare word line SWL is activated to H level and each of word lines WL0 to WL3 is inactivated to L level. Accordingly, if access to the defective memory cell row is indicated, access to the spare row in place of the defective memory cell row is executed. As a result, it is possible to replace and repair the defective memory cell and to execute normal read operation.

According to the configuration of the first embodiment, it is possible to store the redundant information used for replacement and repair in a nonvolatile manner using program cells PMC each of which is the same in configuration as the normal memory cell and the spare memory cell and which is formed to have a small area.

As a result, it is possible to magnetically write data as in the case of normal data write without requiring a special processing step and a dedicated equipment and without causing physical destruction. It is, therefore, possible to program the redundant information without causing the increase of processing time and processing cost and further without fear of deteriorating the operation reliability of the overall device.

Moreover, since program units PU each of which stores 1-bit information using two program cells PMC storing data at different levels, respectively, are provided, it is possible to simplify the configuration of program sense amplifiers PSA for reading information from program units PU, respectively, as shown in FIG. 3.

Second Embodiment

Figure 7:
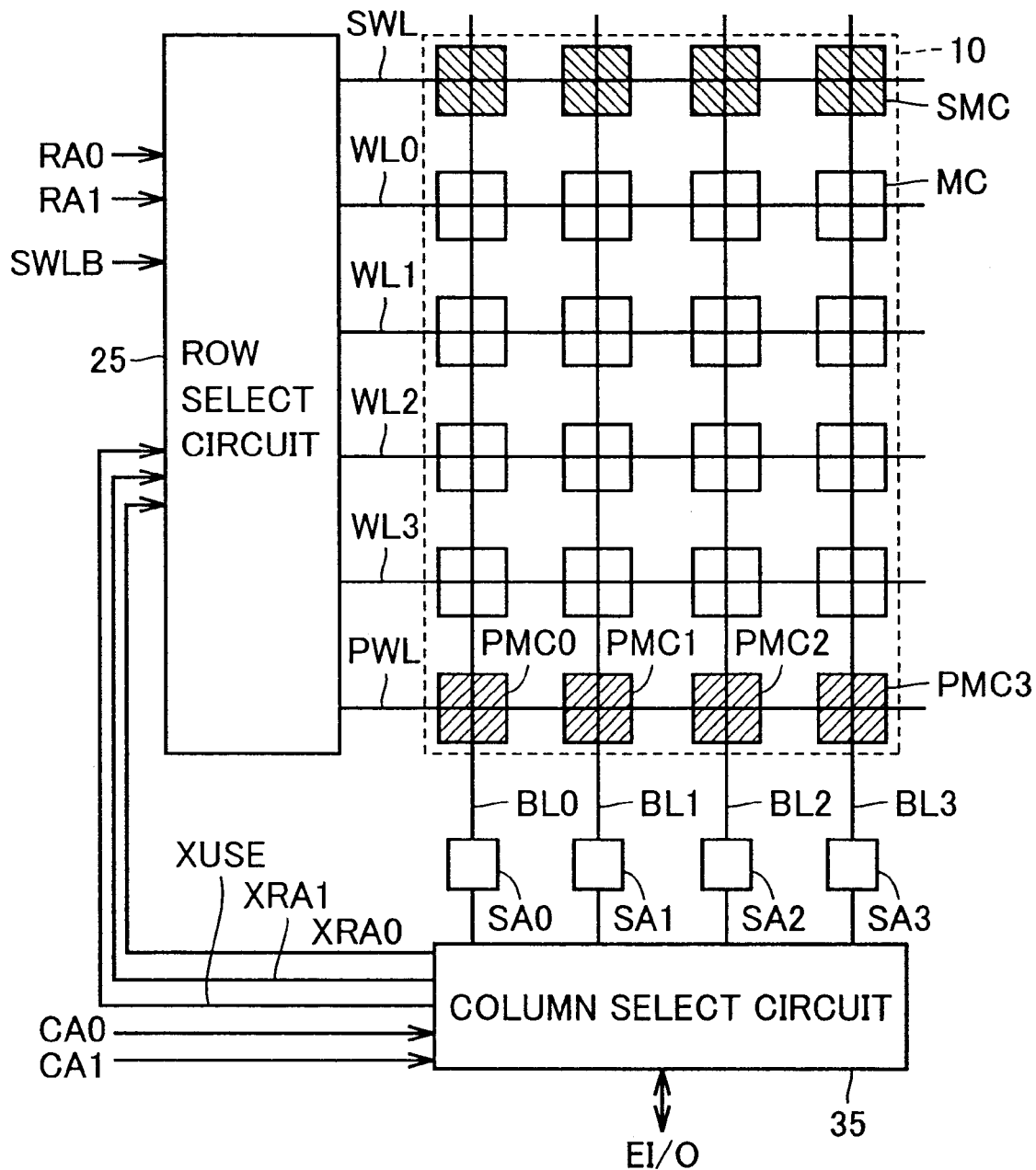
FIG. 7 is a block diagram showing a configuration of an MRAM device according to a second embodiment of the present invention.

FIG. 7 typically shows the configuration of a circuit group related to data read operation and including a redundant configuration, in an MRAM device 2 according to the second embodiment.

Referring to FIG. 7, in the configuration according to the second embodiment, program cells PMC are arranged so that each memory cell row is shared among program cells PMC, normal memory cells MC and spare memory cells SMC in memory array 10. In addition, each program cell PMC stores 1-bit information which constitutes redundant information, in a nonvolatile manner.

Program signals XRA0, XRA1 and XUSE, for example, are stored using program cells PMC0 to PMC2, respectively. The redundant information is written to program cells PMC by the same data write operation as the normal data write operation for writing data to the normal memory cells.

That is, as in the case of the first embodiment, in memory array 10, normal memory cells MC are arranged in 4 rows×4 columns, spare memory cells SMC are arranged in 1 row×4 columns and program cells PMC (PMC0 to PMC3) are arranged in 1 row×4 columns. In other words, spare memory cells SMC, memory cells MC and program cells PMC which are the same in configuration are arranged in 6 rows×4 columns in overall memory array 10.

In the configuration according to the second embodiment, bit lines BL0 to BL3 and sense amplifiers SA1 to SA3 are each arranged to correspond to a memory cell column shared among spare memory cells SMC, normal memory cells MC and program memory cells PMC. That is, the second embodiment differs in configuration from the first embodiment in that data is read from program cells PMC by bit lines BL0 to BL3 and sense amplifiers SA0 to SA3 as in the case of spare memory cells SMC and normal memory cells MC, respectively. Due to this, it is unnecessary to arrange a dedicated circuit for reading data from program cells PMC, thereby making it possible to simplify the circuit arrangement.

Further, MRAM device 2 differs from MRAM device 1 in that a row select circuit 25 and a column select circuit 35 are provided in place of row select circuit 20 and column select circuit 30, respectively. Since the remaining constituent elements of MRAM device 2 are the same as those of MRAM device 1 according to the first embodiment, they will not be repeatedly described herein in detail.

Figure 8:
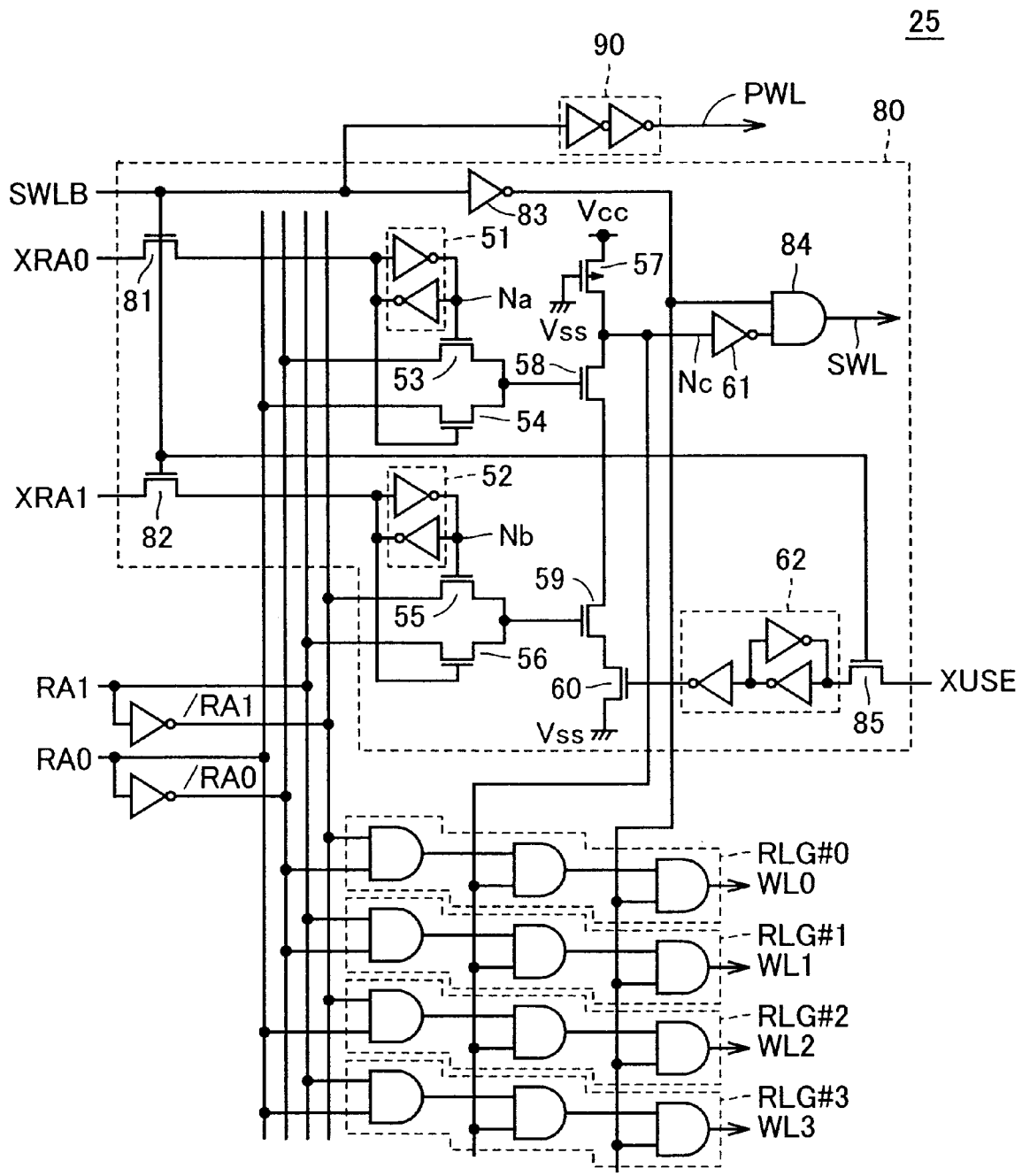
FIG. 8 is a circuit diagram showing a configuration of a row select circuit according to the second embodiment.

FIG. 8 is a circuit diagram showing the configuration of row select circuit 25 according to the second embodiment.

Referring to FIG. 8, row select circuit 25 includes a spare decoder 80 and row select gates RLG#0 to RLG#3 corresponding to a normal row decoder.

Spare decoder 80 differs in configuration from spare decoder 50 shown in FIG. 4 by further including a transistor gate 81 which controls the transmission of program signal XRA0 to a latch circuit 51, a transistor gate 82 which controls the transmission of program signal XRA1 to a latch circuit 52, an inverter 83 which inverts a control signal SWLB, a logic gate 84 which drives the voltage of spare word line SWL, and a transistor gate 85 which controls the transmission of program signal XUSE to a latch circuit 62. In addition, a signal buffer 90 which drives program word line PWL in accordance with control signal SWLB is arranged in spare decoder 80.

Control signal SWLB is activated to H level for a predetermined period before at least the execution of normal data read operation, so as to read data stored in program cells PMC, i.e., to read out redundant information. While control signal SWLB is activated, program word line PWL is activated to H level. In response to the activation of program word line PWL, data stored in program cells PMC0 to PMC3 are read to bit lines BL0 to BL3, respectively.

Figure 9:
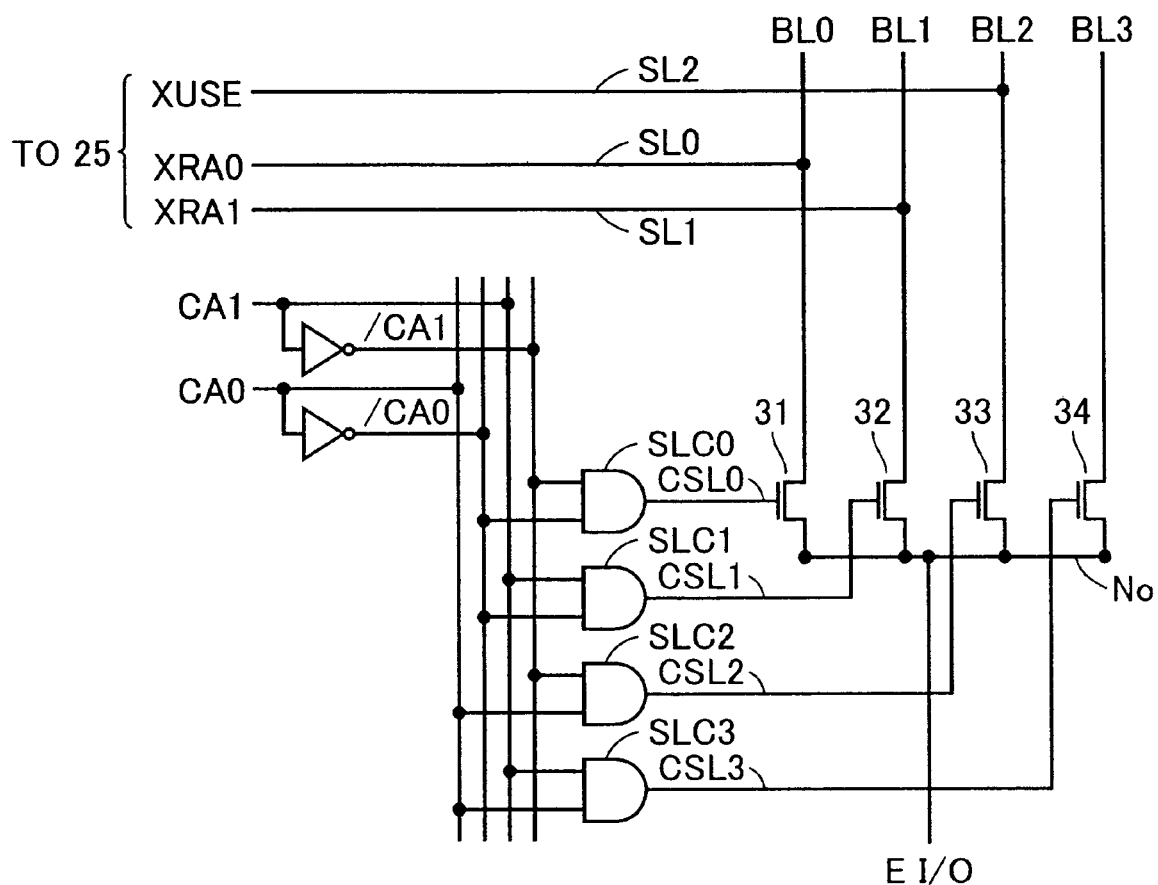
FIG. 9 is a circuit diagram showing a configuration of a column select circuit according to the second embodiment.

Referring to FIG. 9, column select circuit 35 according to the second embodiment differs in configuration from column select circuit 30 according to the first embodiment by further including program signal lines SL0 to SL2 which transmit program signals XRA0, XRA1 and XUSE, respectively. Since the remaining constituent elements of column select circuit 35 are the same as those of column select circuit 30, they will not be repeatedly described herein in detail.

Program signal lines SL0 to SL2 are arranged to transmit data on bit lines BL0 to BL2 to row select circuit 25, respectively. By adopting such a configuration, it is possible to read out the redundant information stored in the program cells by the same operation as normal data read operation. Prior to the normal operation, program signals XRA0, XRA1 and XUSE generated based on the stored data (redundant information) of program cells PMC are transmitted from column select circuit 35 to row select circuit 25.

Referring back to FIG. 8, transistor gate 81 transmits program signal XRA0 from column select circuit 35 to latch circuit 51 in response to the activation of control signal SWLB. Likewise, transistor gates 82 and 85 transmit program signals XRA1 and XUSE from column select circuit 35 to latch circuits 52 and 62, respectively, in response to the activation of control signal SWLB. As a result, the gate voltages of transistors 58, 59 and 60 and the voltage of node Nc are set in the same manner as that described in the first embodiment.

Logic gate 84 drives spare word line SWL in response to control signal SWLB inverted by inverter 83 and the output of inverter 61. In the active period of control signal SWLB, i.e., a period in which data is read from program cells PMC, therefore, spare word line SWL is kept inactive. Further, in periods other than the period in which data is read from program cells PMC, the activation of spare word line SWL is controlled according to the voltage level of node Nc as in the case of the first embodiment.

Row select gates RLG#0 to RLG#3 which constitute the normal row decoder execute AND operation result for not only the outputs of row select gates RLG0 to RLG3 according to the first embodiment but also the output of inverter 83 and control the activation of word lines WL0 to WL3.

That is to say, in the period in which data is read from program cells PMC (control signal SWLB=H level), each of word lines WL0 to WL3 is fixedly inactivated. In periods other than the period in which data is read from program cells PMC (control signal SWLB=L level), the activation of word lines WL0 to WL3 is controlled as in the case of the first embodiment.

Figure 10:
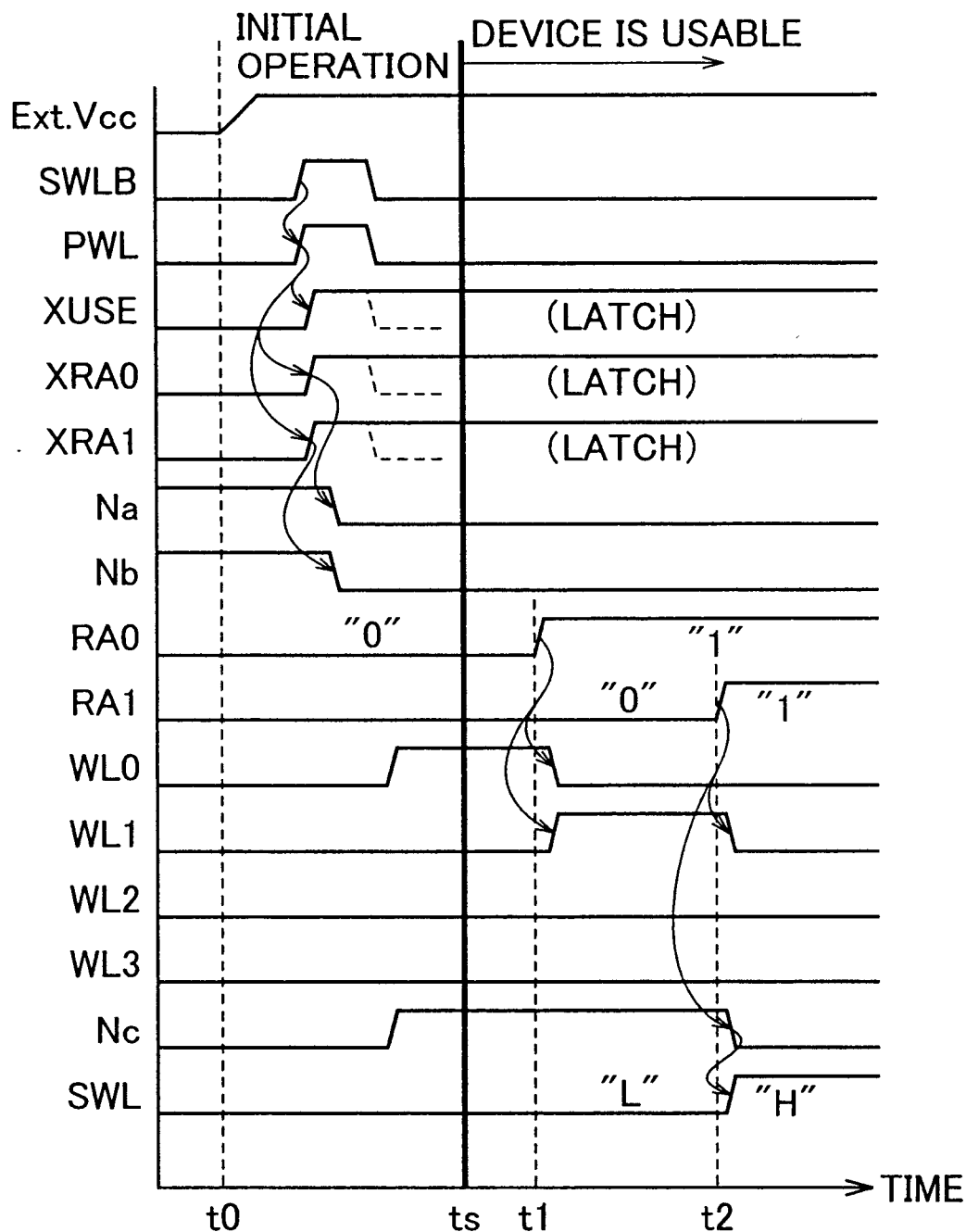
FIG. 10 is an operating waveform view explaining the operation of MRAM device according to the second embodiment.

Referring to FIG. 10, at time t0, when MRAM device 1 is turned on to start initial operation, control signal SWLB is activated to H level for a predetermined period to execute reading data from program cells PMC, i.e., to execute reading redundant information as a part of the initial operation. In response to the activation of control signal SWLB, program word line PWL is activated to H level for a predetermined period. For example, control signal SWLB can be activated for a predetermined period in which power-ON detection is triggered, using power-ON detection circuit 45 shown in FIG. 2.

In response to the activation of program word line PWL, the read of redundant information from program cells PMC is executed and data indicating the levels of program signals XRA0, XRA1 and XUSE are read to bit lines BL0 to BL2, respectively. In FIG. 10, it is assumed that each of program signals XRA0, XRA1 and XUSE is set at "1" (H level).

In the period in which data is read from program cells PMC, program signals XRA0, XRA1 and XUSE transmitted to row select circuit 25 are held in latch circuits 51, 52 and 62, respectively. In response to this, nodes Na and Nb are set at L level, respectively. Further, program signal XUSE sets a spare row in a use state. As a result, the gate of transistor 60 is kept at H level and transistor 60 is fixedly turned on.

Consequently, when the read of redundant information from program cells PMC is completed, the redundant information thus read is held in spare decoder 80 by the latch circuits. In response to this, after time ts, the device turns into a usable state and normal data read operation can be executed.

After time ts, in period (time ts to time t1) in which inputted row addresses RA0 and RA1 are set at "0", respectively, spare word line SWL is set to be inactivated (L level) and word line WL0 corresponding to the normal memory cells is activated to H level as in the case of FIG. 6.

Next, at time t1, row addresses are changed and row addresses RA0 and RA1 are set at "1" and "0", respectively. In this case as in the case of FIG. 6, since row addresses RA0 and RA1 are not completely matched to program signals XRA0 and XRA1, respectively, spare word line SWL is kept to be inactivated (L level). Furthermore, in response to the change of the row addresses, word line WL1 in place of word line WL0 is selectively activated (to H level).

At time t2, row addresses are further changed and row addresses RA0 and RA1 are set at "1", respectively. In this state, a defective memory cell row is selected, so that spare word line SWL is activated to H level and each of word lines WL0 to WL3 is inactivated to L level. As in the case of the first embodiment, therefore, it is possible to replace and repair the defective memory cell row including a defective memory cell by the spare row and to execute normal read operation.

Furthermore, in the configuration according to the second embodiment, it is possible to arrange program cells PMC so that same bit lines BL0 to BL3 and sense amplifiers SA0 to SA3 are shared among program cells PMC, normal memory cells MC and spare memory cells SMC. By so arranging, it is unnecessary to separately provide a dedicated sense amplifier for reading redundant information from program cells PMC, making it possible to reduce circuit area.

The configuration in which the spare row is provided to execute the redundancy replacement in units of memory cell rows is typically shown in the embodiments. However, it is possible to store and read the redundant information and to conduct address determination based on the redundant information with the same configuration even by providing a spare column to execute redundancy replacement or by providing a spare data line to execute redundancy replacement.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
 a memory array having a plurality of normal memory cells and a plurality of spare memory cells each for replacing a defective memory cell in said plurality of normal memory cells, arranged in a matrix;
 a plurality of program units each storing redundant information of 1 bit used for the replacing of said defective memory cell;
 a program information read portion for reading said redundant information from said plurality of program units before executing a data read operation; and a select circuit for controlling access to said plurality of normal memory cells and said plurality of spare memory cells in accordance with said redundant information read by said program information read portion and an inputted address signal, wherein each of said program units includes two program cells each having a same configuration as a configuration of each of said normal memory cells and said spare memory cells, and said two program cells store data at different levels, respectively.

2. The thin film magnetic memory device according to claim 1, wherein said program information read section includes:

a power-ON detection circuit for detecting whether said thin film magnetic memory device is turned on; and a plurality of program information read units provided to correspond to said plurality of program units, respectively, and each reading information stored in corresponding one of said program units when said thin film magnetic memory device is turned on.

3. The thin film magnetic memory device according to claim 2, wherein each of said program cells includes: a magneto-resistance element having an electric resistance varying in accordance with a level of magnetically written stored data; and an access element turned on when said thin film magnetic memory device is turned on, said magneto-resistance element and said access element being connected in series, each of said program information read units includes:

a first node and a second node connected to a predetermined fixed voltage through the corresponding two program cells, respectively;

a current supply section for supplying a predetermined current to each of said first and second nodes; and a sense amplifier for amplifying a voltage difference between said first node and said second node and for generating a voltage according to the information stored in said corresponding program unit.

4. The thin film magnetic memory device according to claim 1, wherein said plurality of spare memory cells are arranged to constitute at least one spare memory cell row, said program cells are arranged to constitute at least one program memory cell row, said thin film magnetic memory device further comprises:

a word line provided for each row of said normal memory cells;

a spare word line provided for each row of said spare memory cells; and a program word line provided for each row of said program memory cells and activated for a predetermined period at least prior to said data read operation, each of said normal memory cells includes: a magneto-resistance element having an electric resistance varying in accordance with a level of magnetically written stored data; and an access element turned on in response to activation of corresponding word line, said magneto-resistance element and said access element being connected in series, said spare memory cells include: a same magneto-resistance element as said magneto-resistance element of said normal memory cells; and an access element turned on in response to the activation of corresponding spare word line, the magneto-resistive element and the access element being connected in series, said program cells include: a same magneto-resistance element as said magneto-resistive element of said normal memory cells; and an access element turned on in response to the activation of corresponding program word line, the magneto-resistance element and the access element being connected in series, and said select circuit controls the activation of said word line and said spare word line in accordance with said address signal and said redundant information.

5. The thin film magnetic memory device according to claim 4, wherein said program information read section includes a power-ON detection circuit for detecting whether said thin film magnetic memory device is turned on, said program word lines are activated for said predetermined period when said thin film magnetic memory device is turned on, and said select circuit includes a latch circuit for holding said redundant information read from said plurality of program units while said thin film magnetic memory device is turned on.

6. The thin film magnetic memory device according to claim 1, wherein said program information read section includes:

a power-ON detection circuit for detecting whether said thin film magnetic memory device is turned on; and a program information read unit for reading said redundant information from said plurality of program cells for a predetermined period after said thin film magnetic memory device is turned on, in response to output of said power-ON detection circuit, and said select circuit includes a latch circuit for holding said redundant information read from said plurality of program units while said thin film magnetic memory device is turned on.

7. A thin film magnetic memory device comprising:

a memory array having a plurality of normal memory cells, a plurality of spare memory cells for replacing a defective memory cell in said plurality of normal memory cells, and a plurality of program cells for storing redundant information used for replacing said defective memory cell, arranged in a matrix;

a plurality of data lines shared among said plurality of normal memory cells, said plurality of spare memory cells and said plurality of program cells;

a data read circuit for reading data from said plurality of normal memory cells, said plurality of spare memory cells and said plurality of program cells through said data lines; and a select circuit including a latch circuit holding said redundant information read by said data read circuit from said plurality of program cells before executing a data read operation, wherein said select circuit controls access to said plurality of normal memory cells and said plurality of spare memory cells in accordance with an address signal and said redundant information held in said latch circuit.

8. The thin film magnetic memory device according to claim 7, wherein said plurality of normal memory cells, said plurality of spare memory cells and said plurality of program cells are arranged so as to constitute a plurality of normal memory cell rows, at least one spare memory cell row and at least one program memory cell row and so as to share memory cell columns among said plurality of said plurality of normal memory cells, said plurality of spare memory cells and said plurality of program cells, said thin film magnetic memory device further comprises:
- a plurality of word lines provided to said normal memory cell rows, respectively;
- a spare word line provided for each row of said spare memory cells, respectively; and
- a program word line provided for each row of said program cells, and activated for a predetermined period before said data read operation, said data lines are provided for said memory cell columns, respectively, and said select circuit receives said redundant information through said data lines for said predetermined period, and controls activation of said plurality of word lines and said spare word line in accordance with said address signal and said redundant information during said data read operation.

* * * * *